United States Patent [19]

Fuyama et al.

[11] Patent Number: 4,857,802
[45] Date of Patent: Aug. 15, 1989

[54] THIN FILM EL ELEMENT AND PROCESS FOR PRODUCING THE SAME

[75] Inventors: Moriaki Fuyama; Katsumi Tamura, both of Hitachi; Kazuo Taguchi, Katsuta; Kenichi Onisawa, Hitachi; Akira Sato, Takahagi; Kenichi Hashimoto, Katsuta; Takahiro Nakayama; Yoshio Abe, both of Hitachi, all of Japan

[73] Assignee: Hitachi, Ltd., Tokyo, Japan

[21] Appl. No.: 100,758

[22] Filed: Sep. 24, 1987

[30] Foreign Application Priority Data

Sep. 25, 1986 [JP] Japan .................................. 61-224879

[51] Int. Cl.$^4$ .......................... H01J 1/70; C23C 15/00
[52] U.S. Cl. ..................................... 313/506; 313/509; 427/66; 204/192.1
[58] Field of Search ....................... 313/506, 509, 501; 427/66; 428/917; 204/192.1

[56] References Cited

U.S. PATENT DOCUMENTS 3,283,194 11/1966 Rulon .................................. 313/509
4,027,192 5/1977 Hanak .............................. 313/506 X
4,416,933 11/1983 Antson et al. ......................... 427/66
4,534,840 8/1985 Shindo et al. ...................... 43.7/107
4,547,703 10/1985 Fujita et al. .......................... 313/509
4,672,266 6/1987 Taniguchi et al. .................. 313/509

Primary Examiner—Donald J. Yusko
Assistant Examiner—Michael Horabik
Attorney, Agent, or Firm—Antonelli, Terry & Wands

[57] ABSTRACT

A thin film EL element which comprises an insulating substrate, a transparent electrode, a first insulating layer, a light-emitting layer, a second insulating layer and a back side electrode, successively laid one upon another, at least one of the first and second insulating layers being composed of a material having a perovskite crystal structure, for example, a layer of $SrTiO_3$, $PbTiO_3$ or $BaTiO_3$, particularly a $SrTiO_3$. The material having the perovskite crystal structure has an increased (111) plane orientation such that the diffraction intensity ratio of (111) plane to (110) plane, I (111)/I (110), is more than 0.5. The material can be a single crystal, having (111) plane orientation. The material is deposited by sputtering, at substrate temperatures of not less than 200° C. and up to the softening point of the insulating substrate, and at a pressure of not more than $1 \times 10^{-2}$ Torr. The material has a high dielectric constant, a high dielectric strength and thus has a high reliability of element performance with a low driving voltage.

10 Claims, 7 Drawing Sheets

THIN FILM EL ELEMENT AND PROCESS FOR PRODUCING THE SAME

BACKGROUND OF THE INVENTION

This invention relates to a thin film EL element, particularly a thin film EL element with an improved insulating layer, and to a process for producing the same.

Basic cross-sectional structure of a conventional thin film EL element is shown in FIG. 7, where a transparent electrode 2 composed of $In_2O_3$, $SnO_2$, etc. is laid on a glass substrate; a first insulating layer 3 of $Y_2O_3$, $Si_3N_4$, $SiO_2$, etc. is formed thereon by sputtering or electron beam vapor deposition; and a light-emitting layer is further formed thereon. In case of yellowish orange light emission, the light-emitting layer can be formed by electron beam vapor deposition or sputtering of sintered pellets of ZnS doped with Mn as a dopant. As other sintered pellets for the light-emitting layer, sintered pellets of ZnS doped with $TbF_3$ or TbP as a dopant for green light emission, those doped with $SmF_3$ for red light emission and those doped with $TmF_3$ for blue light emission are available. A second insulating layer 5 composed of the similar material to that used in the first insulating layer 3 is laid on the light-emitting layer 4, and further a back side electrode 6 composed of Al, Au, etc. is formed thereon by vapor deposition. An AC power source is connected to the transparent electrode 2 and the back side electrode 6 to drive the thin film EL element. Some of thin film EL elements of such a double insulating layer structure are now commercially available, but still have such problems as a low emission brightness, a high driving voltage, a low emission efficiency and a low reliability of element performance. Thus, research and development of thin film EL elements have been now extensively made for improvement of light emission characteristics, that is, a higher emission brightness, a lower driving voltage, a higher emission efficiency and a higher reliability of element performance.

Such thin film EL elements are disclosed, for example, in Japanese Patent Application Kokai (Laid-open) Nos: 58-216391 and 52-129296; Shingaku Gizyutsu, Vol. 85, No. 32, ED85-6 (May issue, 1985).

Improvement of the light emission characteristics of the thin film EL elements depends upon how to prepare a high quality insulating layer or how to select a most appropriate insulating layer structure, because the light emission of the thin film EL element takes place when an electric field of about $8 \times 10^5$ to about $1 \times 10^6$ V/cm is applied to the light-emitting layer, and thus the insulating layers must have a dielectric breakdown strength (dielectric strength) above that value.

As the material for the insulating layer, SiO, $SiO_2$, $Y_2O_3$, $Al_2O_3$, $Si_3N_4$, etc. have been so far used, but the portion of applied voltage shared by the insulating layer is very large owing to the low dielectric constant of these insulating layer materials. Thus, a very high driving voltage is required for emitting the light-emitting layer.

In order to lower the driving voltage, thin film EL elements using insulating layer materials having a higher dielectric constant than those of $SiO_2$, $Ta_2O_5$, etc., that is, $SrTiO_3$, $PbTiO_3$ and $BaTa_2O_6$ have been investigated. However, $SrTiO_3$, $PbTiO_3$ and $BaTa_2O_6$ have a higher dielectric constant, but are liable to undergo dielectric breakdown and thus have a low dielectric breakdown strength.

Generally, the dielectric breakdown strength of these insulating layer materials greatly depends upon conditions for forming the insulating layer, and thus how to prepare a high quality insulating layer is an important task.

The conventional thin film EL element using an insulating layer material having a low dielectric constant requires a very high driving voltage, whereas a thin film EL element using an insulating layer material having a high dielectric constant has a low dielectric breakdown strength.

SUMMARY OF THE INVENTION

An object of the present invention is to provide a thin film EL element having a high reliability of element performance and a low driving voltage by using an insulating layer having a high dielectric constant and a high dielectric breakdown strength.

The present inventors have paid attention to a $SrTiO_3$ film having a high dielectric constant to solve the problems of the insulating layer in the conventional thin film EL element and have tried to improve the dielectric breakdown strength of the $SrTiO_3$ film. The present inventors have made various investigations of conditions for forming the $SrTiO_3$ film and have found that the dielectric breakdown strength of the $SrTiO_3$ film can be improved by increasing the percentage of plane orientation (111) of the $SrTiO_3$ film to a considerable degree, that is, a thin film EL element having a high reliability and a low driving voltage can be obtained by using a $SrTiO_3$ film having a high dielectric constant, whose (111) plane is increased to a considerable degree, as an insulating layer.

Use of a $SrTiO_3$ film as an insulating layer is mentioned in the said literature "Shingaku", Vol. 85, No. 32, ED85 -6 (May issue, 1985), which however nowhere discloses conditions for forming specific $SrTiO_3$ films and their film characteristics. That is, relations between the crystal plane of a $SrTiO_3$ film and the dielectric breakage strength $E_{BD}$ have not been clarified yet up to now.

The present invention is based on the foregoing findings. According to a first aspect of the present invention, there is provided a thin film EL element which comprises an insulating substrate, a transparent electrode, a first insulating layer, a light-emitting layer, a second insulating layer and a back side electrode, successively laid one upon another, at least one of the first and second insulating layers being composed of a crystal film having a perovskite structure, particularly, a $SrTiO_3$ film, whose (111) plane orientation is increased to a considerable degree.

According to a second aspect of the present invention there is provided a process for producing a thin film EL element comprising an insulating substrate, a transparent electrode, a first insulating layer, a light-emitting layer, a second insulating layer and a back side electrode, successively laid one upon another, which comprises forming at least one of the first and second layers as a crystal film having a perovskite structure, particularly a $SrTiO_3$ film, whose (111) plane orientation is increased to a considerable degree, by sputtering.

DETAILED DESCRIPTION OF THE INVENTION

The present invention will be described in detail below particularly as to the characteristics as so far briefly mentioned above.

The present inventors have investigated the dielectric breakdown strength of SrTiO₃ films formed by sputtering, where glass substrates each with a transparent electroconductive layer formed on one side thereof to a thickness of 2,000 Å were used. SrTiO₃ films were each formed on the individual transparent electroconductive films by sputtering in the presence of an Ar gas containing 10% by volume of O₂ as a reactant gas under a constant pressure P, i.e. 1×10⁻² Torr, while changing the substrate temperature $T_s$ and sputtering power Pw. The dielectric breakdown strength of the thus obtained SrTiO₃ films was measured. The results are shown in the following Table.

TABLE

Dielectric Breakdown Strength $E_{BD}$ (10⁶V/cm) of SrTiO₃ Films

| | Sputtering Power Pw (W) | | |
|---|---|---|---|
| | 150 | 200 | 250 |
| Substrate temperature Ts (°C.) under pressure P, 1 × 10⁻² Torr | | | |
| 25 | 0.20 | 0.20 | 0.11 |
| | 0.11 | | |
| | | 0.42 | |
| 100 | 0.12 | | 0.36 |
| | | 0.46 | |
| 200 | 1.03 | 0.84 | 0.82 |
| 300 | 0.96 | 1.02 | 1.24 |
| 400 | 1.14 | 0.92 | 0.98 |
| 500 | 1.06 | 1.01 | 1.02 |

As is obvious from the Table, the dielectric breakdown strength of SrTiO₃ films depends upon the substrate temperature Ts when the SrTiO₃ films are formed, and the SrTiO₃ films having a dielectric breakdown strength above about 8×10⁵—about 1×10⁶ V/cm can be obtained at a substrate temperature of at least 200° C.

Figure 2:
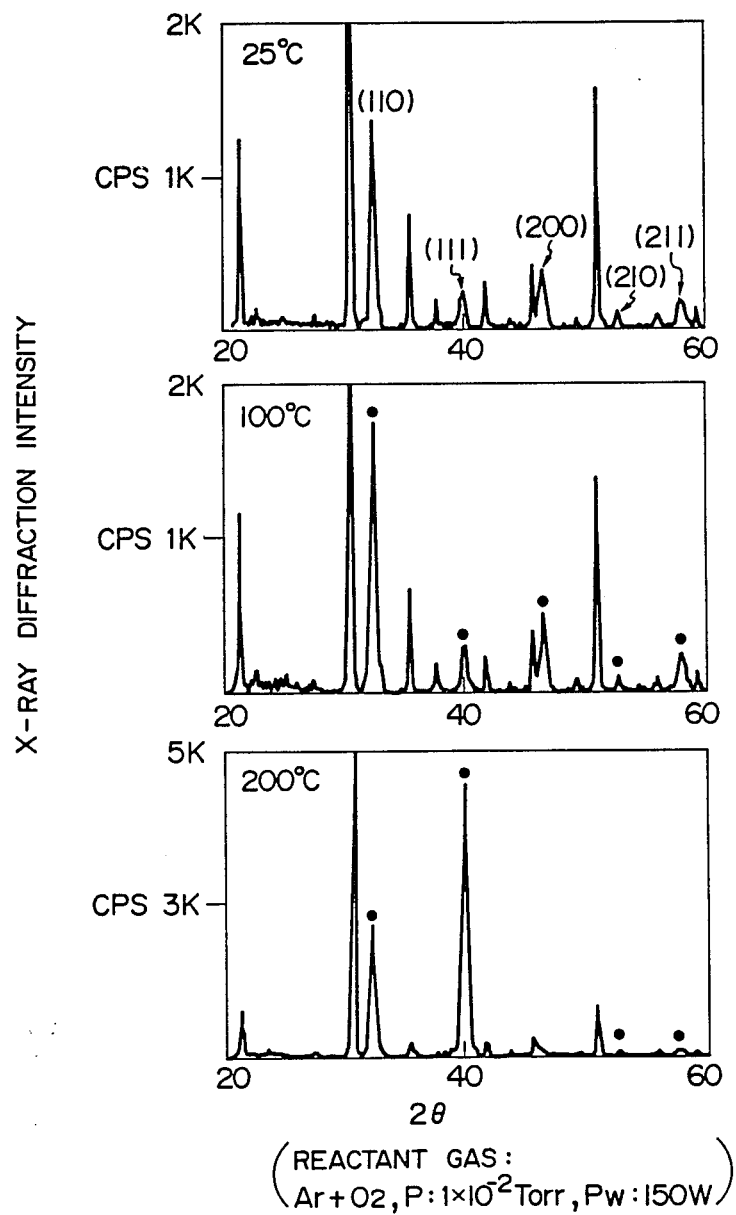
FIG. 2 shows diagrams showing X-ray analysis of SrTiO₃ films.

Then, how the structures of the SrTiO₃ films would change with the substrate temperature Ts was investigated by X-ray diffraction. The results are shown in FIG. 2, where diffraction peaks without any indication of crystal face and dot mask are those of single transparent electroconductive films. It is obvious from FIG. 2 that the SrTiO₃ film formed at a substrate temperature Ts of 200° C. has a higher diffraction strength at the (111) plane than those of the SrTiO₃ films formed at substrate temperatures Ts of 25° C. and 100° C., that is, the (111) plane of the SrTiO₃ film formed at a substrate temperature Ts of 200° C. is increased to a considerable degree.

The present inventors presumed from the foregoing results that, in order to improve the dielectric breakdown strength of the SrTiO₃ film, the (111) plane of SrTiO₃ film must be made to grow to a considerable degree, and thus investigated relations between the dielectric breakdown strength and the diffraction intensity ratio of SrTiO₃ films to make sure of the presumption. The results are shown in FIG. 3, where SrTiO₃ films were formed by changing conditions for forming SrTiO₃ films, that is, by changing a pressure P in a range between 0.5 and 5×10⁻² Torr, a substrate temperature Ts in a range between 25° and 200° C. and a sputtering power Pw in a range of 150 and 250 W in the presence of an Ar gas containing 10% by volume of O₂, (which is indicated as Ar+O₂ in FIG. 3) or a Ar gas containing 30% by volume of He and 10% by volume of O₂ (which is indicated as Ar+He+O₂ in FIG. 3) as a reactant gas.

By doping the reactant gas with He, that is, by using an Ar gas containing He or He+O₂, a denser SrTiO₃ film of higher quality can be obtained owing to the self-bias effect, though the deposition rate becomes a little lower. A higher dielectric breakdown strength $E_{BD}$ can be also obtained.

Figure 3:
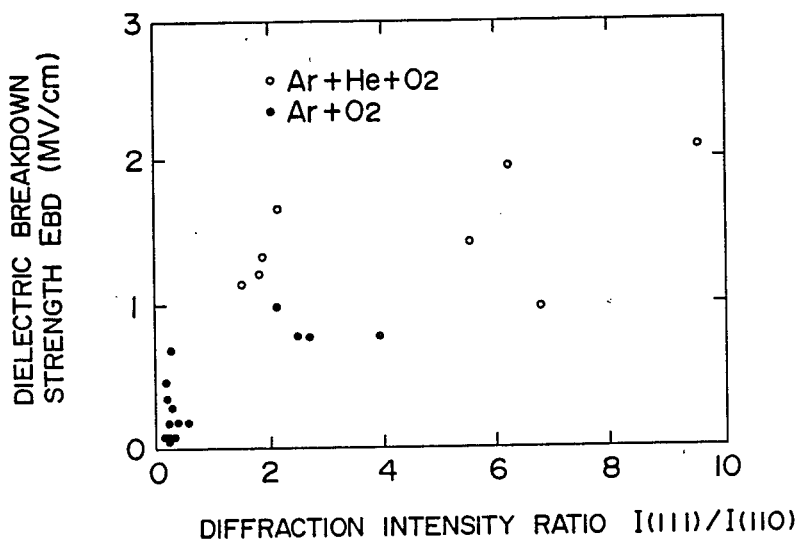
FIG. 3 is a diagram showing relations between the dielectric breakdown strength and the diffraction intensity ratio, I(111)/I(110), of SrTiO₃ films.

In FIG. 3, the diffraction intensity ratio, I(111)/I(110), is a ratio of the diffraction intensity at the (111) plane to that at the (110) plane. It is obvious from FIG. 3 that there is a correlation between the dielectric breakdown strength and the diffraction intensity ratio. That is, in order to increase the dielectric breakdown strength, the diffraction intensity ratio, I(111)/I(110), must be increased. It is also obvious from FIG. 3 that the diffraction intensity ratio, I(111)/I(110), can be made higher with the reactant gas doped with He, i.e. an Ar gas containing He, or O₂ and He than with an Ar gas containing O₂, and the dielectric breakdown strength can be thus increased. It can be seen from the foregoing facts that the doping effect of He on the reactant gas is remarkable.

Since the insulating layer of a thin film EL element is satisfactory, if it can have a dielectric breakdown strength of at least about 8×10⁵—about 1×10⁶ V/cm, as described before, it can be also seen from FIG. 3 that the diffraction intensity ratio, I(111)/I(110), must be more than 0.5. That is, it can be seen from the foregoing results that the (111) plane of a SrTiO₃ film is made to grow to a considerable degree in comparison to other crystal planes, more specifically, so that the SrTiO₃ film can have a diffraction intensity ratio, I(111)/I(110), of more than 0.5.

In this connection, the substrate temperature necessary for forming a SrTiO₃ film whose (111) plane is increased to a considerable degree is at least 200° C. and less than the softening temperature of the substrate.

Figure 4:
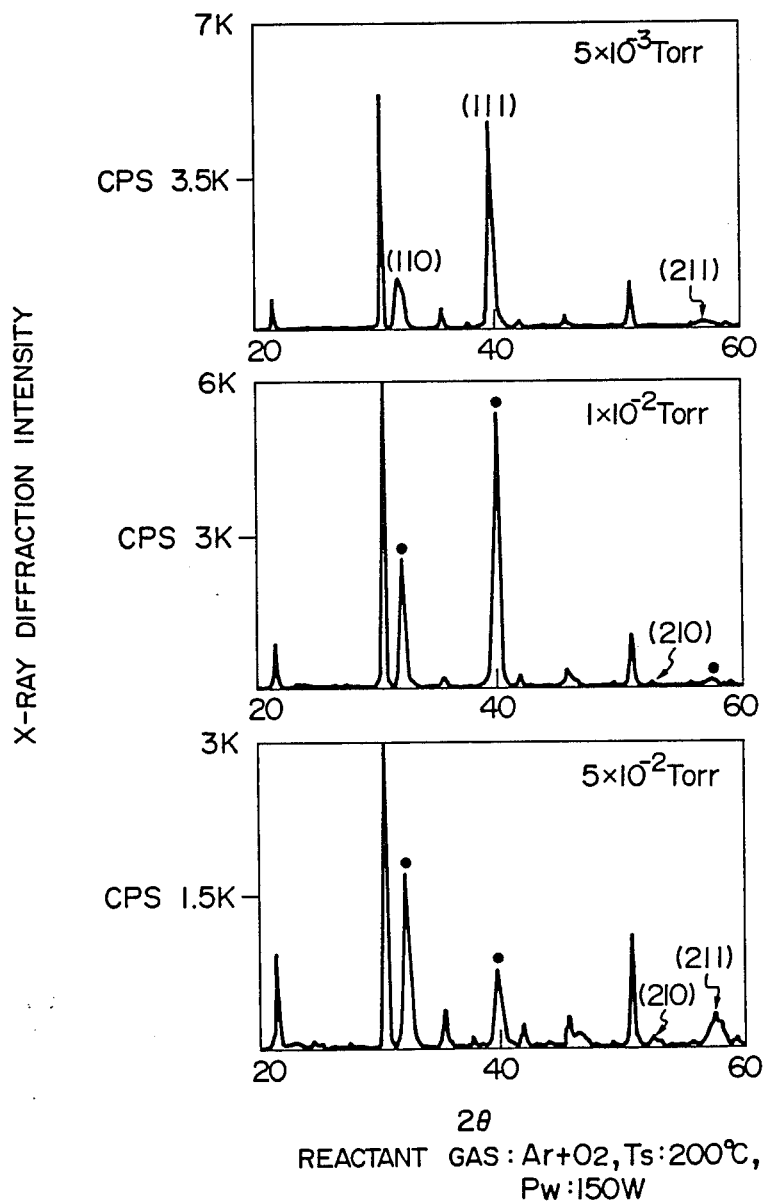
FIG. 4 shows diagrams showing X-ray analysis of SrTiO₃ films.

The present inventors have also found by further investigation that the pressure, i.e. degree of vacuum at the sputtering is also related to the growth of the (111) plane of a SrTiO₃ film to a considerable degree as a condition other than the substrate temperature Ts. The results are shown in FIG. 4, where SrTiO₃ films were formed at a constant substrate temperature Ts of 200° C. with a constant sputtering power Pw of 150 W in the presence of an Ar gas containing 10% by volume of O₂, while changing the pressure in a range between $0.5 \times 10^{-3}$ and $5 \times 10^{-2}$ Torr. It can be seen from FIG. 4 that the diffraction intensity at the (111) face of the SrTiO$_3$ film formed under $5 \times 10^{-2}$ Torr is lower than those obtained under lower pressures. Thus, it can be seen therefrom that the pressure must be not more than $1 \times 10^{-2}$ Torr during the sputtering.

When conventional SrTiO$_3$ films having a high dielectric constant were applied to EL elements, picture element breakage was liable to take place owing to their low dielectric breakdown strength, and thus their practical applications have been regarded as impossible. Under these circumstances, the present inventors have found that a SrTiO$_3$ film whose (111) plane is increased to a considerable degree has a high dielectric breakdown strength, and a thin film EL element using such a SrTiO$_3$ film can be operated at a lower driving voltage and can have a higher reliability of element performance with less picture element breakage.

The present inventors have further investigated why the SrTiO$_3$ film whose (111) plane is increased to a considerable degree has a higher dielectric breakdown strength. The results are shown in FIG. 5, where the etching rates of the SrTiO$_3$ films formed under various conditions are shown.

Figure 5:
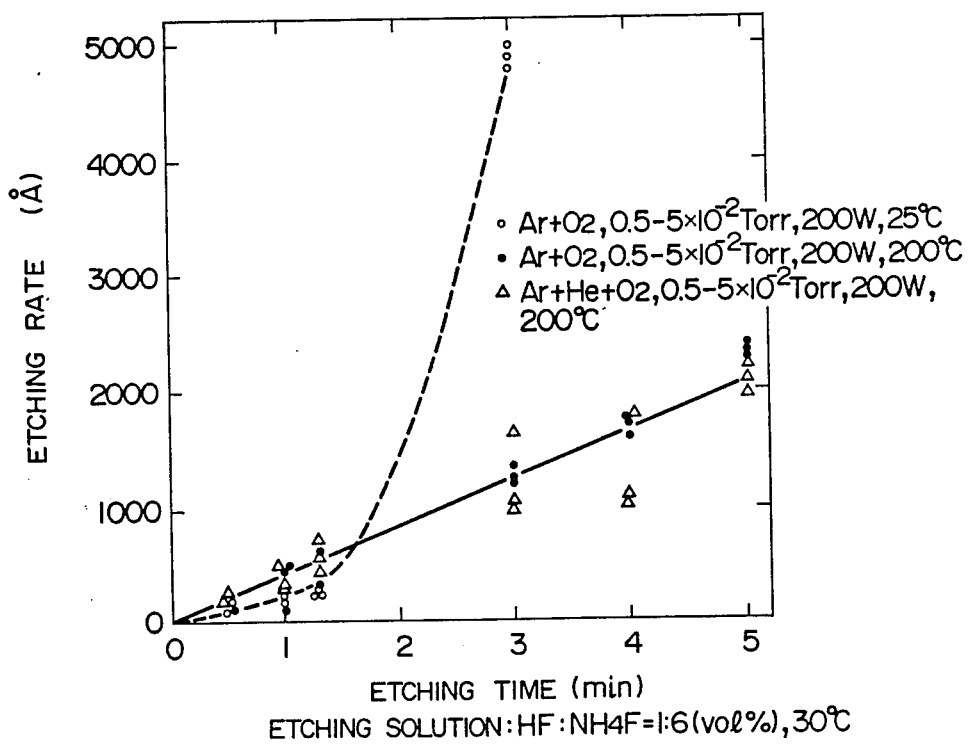
FIG. 5 is a diagram showing etching rates of SrTiO₃ films.

It is obvious from FIG. 5 that the SrTiO$_3$ films formed at a substrate temperature Ts of 200° C., that is, the SrTiO$_3$ films whose (111) plane is increased to a considerable degree, have lower etching rates than those of the films formed at a substrate temperature Ts of 25° C. That is, a lower etching rate means that a denser SrTiO$_3$ film is formed. Thus, the SrTiO$_3$ film whose (111) plane is increased to a considerable degree is denser, and thus has a higher quality. It can be presumed that the resulting denser film leads to a higher dielectric breakdown strength of the present thin film EL element.

PREFERRED EMBODIMENTS OF THE INVENTION

Figure 1:
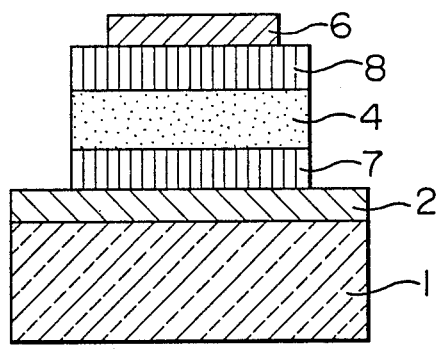
FIG. 1 is a cross-sectional view of a thin film EL element according to one embodiment of the present invention.

FIG. 1 is a cross-sectional view of a display panel utilizing a thin film EL element according to one embodiment of the present invention. The present invention will be described in detail below, referring to this embodiment according to its process steps.

A transparent electrode 2 composed of SnO$_2$, In$_2$O$_3$, etc. having an area resistance of 10–20 $\Omega$/cm$^2$ was formed on a glass substrate 1 made of Corning #7059 glass to a thickness of about 2,000 Å by sputtering or electron beam vapor deposition. In case of sputtering, reactive sputtering was carried out with Sn or In as a target or with a sintered target of 95 wt. % InO$_3$—5 wt. % SnO$_2$ in the presence of an Ar gas containing 10% by volume of O$_2$ as a reactant gas.

Then, the transparent electrode 2 was etched with a parallel band pattern by photo-etching to obtain a necessary electrode pattern for the EL element, where any of an HCl—HNO$_3$ based etching solution or a HBr etching solution was used.

Then, a first insulating layer 7 of the present invention was formed onto the transparent electrode 2 to a thickness of 0.5 $\mu$m. That is, a SrTiO$_3$ film as the first insulating layer 7 was formed at a substrate temperature of 200° C., a pressure of $1 \times 10^{-2}$ Torr and a sputtering power density of 2 W/cm$^2$ in the presence of an Ar gas containing 30% by volume of He and 10% by volume of O$_2$ as a reactant gas. X-ray analysis of the SrTiO$_3$ film revealed that the (111) face was increased to a considerable degree and the diffraction intensity ratio, I(111)/I(110), was about 4.2. It was presumed that a high dielectric breakdown strength was obtained. In fact, it was found by actual measurement of the dielectric breakdown strength of the resulting thin film EL element that the dielectric breakdown strength was $2.3 \times 10^6$ V/cm.

Then, a light-emitting layer 4 was formed thereon to a thickness of 0.5 $\mu$m by electron beam vapor deposition of a ZnS:Mn sintered material, and subjected to vacuum heat treatment at an elevated substrate temperature of 550° C., whereby ZnS was uniformly doped with Mn as a dopant.

Then, a second insulating layer 8 was formed on the light-emitting layer 4 to a thickness of 0.5 $\mu$m in the same manner as the first insulating layer 7 was formed.

Then, a back side electrode 6 was formed thereon to a thickness of about 2,000 Å by electron beam vapor deposition of Al, Au, etc. with resistance heating. Then, the thus prepared EL element was subjected to an application of 1 KHz sine wave voltage to conduct thorough aging treatment and then its life characteristics were investigated.

Figure 6:
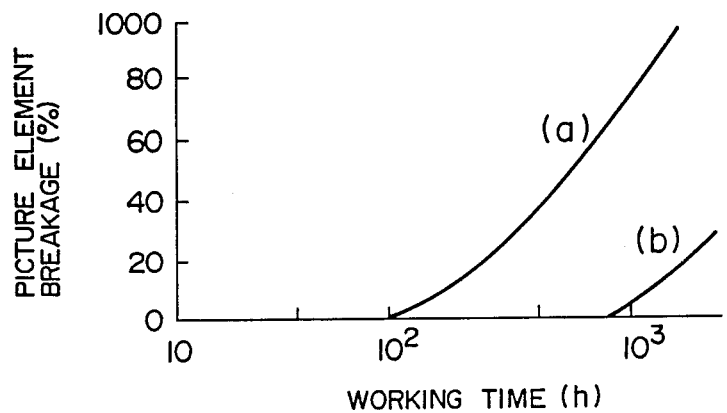
FIG. 6 is a diagram showing life of thin film EL elements.
Figure 7:
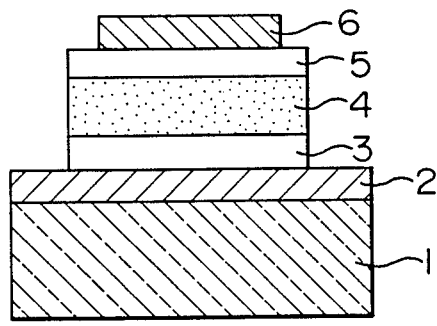
FIG. 7 is a cross-sectional view of a conventional thin film EL element.

FIG. 6 shows relations between the continuous working time and the picture element breakage, wherein the curve (a) is directed to a thin film EL element using a SrTiO$_3$ film having an I(111)/I(110) ratio of 0.2, formed at a substrate temperature of 25° C. as the insulating layers and the curve (b) is directed to the present thin film EL element as prepared above. It is obvious from FIG. 6 that the present thin film EL element has a lower picture element breakage and thus has a higher reliability of element performance and a longer life.

In order to improve the dielectric breakdown strength of the SrTiO$_3$ film, the (111) plane must be increased to a considerable degree, as described above, and thus a thin film EL element having a very distinguished dielectric breakdown strength and a higher reliability can be obtained by using a SrTiO$_3$ film having only the (111) plane, prepared through growth of single crystal of the SrTiO$_3$, as insulating layers. In order to make a SrTiO$_3$ film having only the (111) plane, that is, a film of single SrTiO$_3$ crystal, sputtering must be carried out under a pressure of not more than $10^{-9}$ Torr in an ultra high vacuum apparatus such as MBE, etc. In this case, the insulating layers 7 and 8 in the present EL element structure of FIG. 1 must be composed of single SrTiO$_3$ crystal.

It has been also found that an insulating layer of perovskite structure whose (111) plane is increased to a considerable degree such as films of PbTiO$_3$, BaTiO$_3$, etc. can have the same effects as those of the SrTiO$_3$ film whose (111) face is increased to a considerable degree.

As described above, the dielectric breakdown effect of the SrTiO$_3$ film can be improved in the present invention, and thus a thin film EL element using such an insulating layer can be free of the disadvantages of the conventional SrTiO$_3$ insulating layer and can have a lower driving voltage and a higher reliability of element performance.

What is claimed is:

1. A thin film EL element which comprises an insulating substrate, a transparent electrode, a first insulating layer, a light-emitting layer, a second insulating layer and a back side electrode, successively laid one upon another, at least one of the first and second insulating layers being composed of a material of perovskite crystal structure whose crystal has been grown preferentially in the (111) plane such that the crystal has a diffraction intensity ratio of (111) plane to (110) plane, I(111)/I(110), of more than 0.5.

2. A thin film EL element according to claim 1, wherein the material of perovskite crystal structure is $SrTiO_3$, $PbTiO_3$ or $BaTiO_3$.

3. A thin film EL element which comprises an insulating substrate, a transparent electrode, a first insulating layer, a light-emitting layer, a second insulating layer and a back side electrode, successively laid one upon another, at least one of the first and second insulating layers being composed of $SrTiO_3$ whose crystal has been grown preferentially in the (111) plane such that the crystal has a diffraction intensity ratio of (111) plane to (110) plane, I(111)/I(110), of more than 0.5.

4. A process for producing a thin film EL element, comprising successively forming, on an insulating substrate, a transparent electrode, a first insulating layer, a light-emitting layer, a second insulating layer and a back side electrode, laid one upon another, wherein at least one of the first and second insulating layers is a layer of material having a perovskite crystal structure, said layer of material being formed by sputtering carried out at a substrate temperature of not less than 200° C. to less than the softening point of the insulating substrate, and under a pressure of not more than $1 \times 10^{-2}$ Torr, said layer of material being a layer having a diffraction intensity ratio of (111) plane to (110) plane, I(111)/I(110), after being formed by sputtering, of more than 0.5.

5. A process according to claim 4, wherein the sputtering is carried out in the presence of a gas mixture of Ar and He or a gas mixture of Ar, He and $O_2$ as a reactant gas.

6. A process according to claim 4, wherein the layer of material having a perovskite crystal structure is a layer of $SrTiO_3$, $PbTiO_3$ or $BaTiO_3$.

7. A process for producing a thin film EL element, comprising successively forming, on an insulating substrate, a transparent electrode, a first insulating layer, a light-emitting layer, a second insulating layer and a back side electrode, laid one upon another, wherein at least one of the first and second insulating layers is a layer of $SrTiO_3$ formed by sputtering, the sputtering being carried out at a substrate temperature of not less than 200° C. to less than the softening point of the insulating substrate, and under a pressure of not more than $1 \times 10^{-2}$ Torr, and wherein the layer of $SrTiO_3$ is a layer having a diffraction intensity ratio of (111) plane to (110) plane, I(111)/I(110), after being formed by sputtering, of more than 0.5.

8. A process according to claim 7, wherein the sputtering is carried out in the presence of a gas mixture of Ar and He, or a gas mixture of Ar, He and $O_2$ as a reactant gas.

9. A process for producing a thin film EL element, comprising successively forming, on an insulating substrate, a transparent electrode, a first insulating layer, a light-emitting layer, a second insulating layer and a back side electrode, laid one upon another, wherein at least one of the first and second insulating layers is a layer of material having a perovskite crystal structure, said layer of material being formed by sputtering carried out at a substrate temperature of not less than 200° C. to less than the softening point of the insulating substrate, and under a pressure of not more than $1 \times 10^{-2}$ Torr, the sputtering being carried out in the presence of a gas mixture of Ar and He or a gas mixture of Ar, He and $O_2$ as a reactant gas.

10. A process for producing a thin film EL element, comprising successively forming, on an insulating substrate, a transparent electrode, a first insulating layer, a light-emitting layer, a second insulating layer and a back side electrode, laid one upon another, wherein at least one of the first and second insulating layers is a layer of $SrTiO_3$ formed by sputtering, the sputtering being carried out at a substrate temperature of not less than 200° C. to less than the softening point of the insulating substrate, and under a pressure of not more than $1 \times 10^{-2}$ Torr, and wherein the sputtering is carried out in the presence of a gas mixture of Ar and He or a gas mixture of Ar, He and $O_2$ as a reactant gas.

* * * * *